United States Patent
Lee et al.

(10) Patent No.: US 7,518,151 B2
(45) Date of Patent: Apr. 14, 2009

(54) GALLIUM NITRIDE/SAPPHIRE THIN FILM HAVING REDUCED BENDING DEFORMATION

(75) Inventors: Chang Ho Lee, Suwon-si (KR); Hae Yong Lee, Kwangmyeong-si (KR); Choon Kon Kim, Suwon-si (KR); Kisoo Lee, Suwon-si (KR)

(73) Assignee: Samsung Corning Co., Ltd. (KR)

( * ) Notice: Subject to any disclaimer, the term of this patent is extended or adjusted under 35 U.S.C. 154(b) by 6 days.

(21) Appl. No.: 11/869,080

(22) Filed: Oct. 9, 2007

(65) Prior Publication Data

US 2008/0248259 A1 Oct. 9, 2008

Related U.S. Application Data

(63) Continuation of application No. 11/045,688, filed on Jan. 28, 2005, now Pat. No. 7,315,045.

(30) Foreign Application Priority Data

Jan. 29, 2004 (KR) .................. 10-2004-0005585

(51) Int. Cl.
*H01L 27/15* (2006.01)
*H01L 31/12* (2006.01)
*H01L 33/00* (2006.01)

(52) U.S. Cl. ............... 257/79; 257/631; 257/E33.001; 257/E33.034

(58) Field of Classification Search ............. 257/11, 257/79, 631, E33.001, E33.034
See application file for complete search history.

(56) References Cited

U.S. PATENT DOCUMENTS

| | | | |
|---|---|---|---|
| 6,528,394 | B1 | 3/2003 | Lee |
| 6,824,610 | B2 | 11/2004 | Shibata et al. |
| 6,829,270 | B2 | 12/2004 | Suzuki et al. |
| 7,217,641 | B2 * | 5/2007 | Gehrke et al. ............ 438/481 |

* cited by examiner

*Primary Examiner*—Hoai v Pham
(74) *Attorney, Agent, or Firm*—Baker Hostetler LLP

(57) ABSTRACT

The present invention relates to a gallium nitride/sapphire thin film, wherein a curvature radius thereof is positioned on the right side of a curve plotted from the following functional formula (I):

$$Y = Y_0 + A \cdot e^{-(x_1-1)/T_1} + B \cdot (1 - e^{-x_2/T_2}) \quad (I)$$

wherein
Y is the curvature radius (m) of a gallium nitride/sapphire thin film,
$x_1$ is the thickness (μm) of a gallium nitride layer,
$x_2$ is the thickness (mm) of a sapphire substrate,
$Y_0$ is −107±2.5,
A is 24.13±0.50,
B is 141±4.5,
$T_1$ is 0.56±0.04, and
$T_2$ is 0.265±0.5.

13 Claims, 3 Drawing Sheets

(a)  (b)

GALLIUM NITRIDE/SAPPHIRE THIN FILM HAVING REDUCED BENDING DEFORMATION

This is a continuation of application Ser. No. 11/045,688 filed Jan. 28, 2005, now U.S. Pat. No. 7,315,045.

FIELD OF THE INVENTION

The present invention relates to a gallium nitride/sapphire thin film for an optoelectronic and electronic device, which has reduced bending deformation.

BACKGROUND OF THE INVENTION

A gallium nitride/sapphire thin film, which is useful for an optoelectronic device (eg., LED, LD) or other electronic devices as a substrate, has been conventionally prepared by growing gallium nitride on a sapphire substrate using metal organic chemical vapor deposition (MOCVD), hydride vapor phase epitaxy (HVPE), etc. The gallium nitride/sapphire thin film suffers from bending deformation due to interfacial strain caused by the differences in the lattice parameter and thermal expansion coefficient between sapphire and gallium nitride. The degree of the bending deformation increases as the thickness of a gallium nitride (GaN) layer increases, as can be seen in FIG. 1. Such bending deformation adversely affects the quality and productivity of an optoelectronic and electronic device comprising the gallium nitride/sapphire thin film as a substrate.

In order to reduce such bending deformation, U.S. Pat. No. 6,829,270 discloses a gallium nitride/sapphire thin film obtained by using a sapphire substrate having a thickness of 700 µm much thicker than 430 µm which is commercially available but undergoes increased bending deformation on the growth of gallium nitride thereon.

U.S. Pat. No. 6,528,394 discloses a method for growing gallium nitride having an interface with an embossed shape between a GaN layer and a sapphire substrate by carrying out a first nitridation, a surface-treatment with ammonia ($NH_3$) and hydrogen chloride (HCl) and a second nitridation, in succession, to form an aluminum nitride (AlN) interface, before the growth of gallium nitride.

On studying a gallium nitride/sapphire thin film having a reduced bending deformation and a sufficiently thick gallium nitride layer, the present inventors have found that the bending deformation can be further reduced by controlling the number and size of the embossings formed on an AlN interface between the GaN layer and the sapphire substrate, and this is obtained under various thickness conditions of the sapphire substrate including 430 µm which is commercially available.

SUMMARY OF THE INVENTION

It is, therefore, an object of the present invention to provide a gallium nitride/sapphire thin film having reduced bending deformation under various thickness conditions of the sapphire substrate.

In accordance with the present invention, there is provided a gallium nitride/sapphire thin film, wherein a curvature radius thereof is positioned on the right side of a curve plotted from the following functional formula (I):

$$Y = Y_0 + A \cdot e^{-(x_1-1)/T_1} + B \cdot (1 - e^{-x_2/T_2}) \quad (I)$$

wherein

Y is the curvature radius (m) of a gallium nitride/sapphire thin film,
$x_1$ is the thickness (µm) of a gallium nitride layer,
$x_2$ is the thickness (nm) of a sapphire substrate,
$Y_0$ is $-107\pm2.5$,
A is $24.13\pm0.50$,
B is $141\pm4.5$,
$T_1$ is $0.56\pm0.04$, and
$T_2$ is $0.265\pm0.5$.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

The functional relation between the curvature radius and the gallium nitride thickness is defined by formula (I).

The curvature radius for the inventive gallium nitride/sapphire thin film is positioned on the right side of a curve plotted from formula (I) wherein $Y_0$ is $-107\pm2.5$, A is $24.13\pm0.50$, B is $141\pm4.5$, $T_1$ is $0.56\pm0.04$ and $T_2$ is $0.265\pm0.5$, and preferably, it matches or positioned on the left side of a curve plotted from formula (I) wherein $Y_0$ is $-293\pm2.5$, A is $72.52\pm0.74$, B is $372\pm4.5$, $T_1$ is $1.15\pm0.04$ and $T_2$ is $0.262\pm0.5$.

Figure 1:
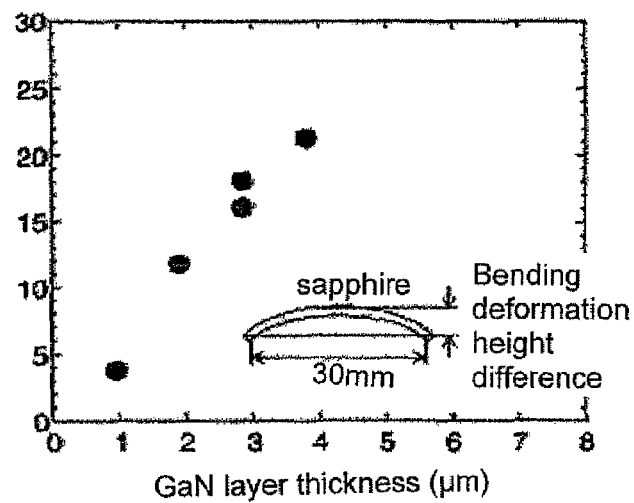
FIG. 1: a graph showing the change in the bending deformation depending on the thickness of the gallium nitride layer in the prior gallium nitride/sapphire thin film.
Figure 2:
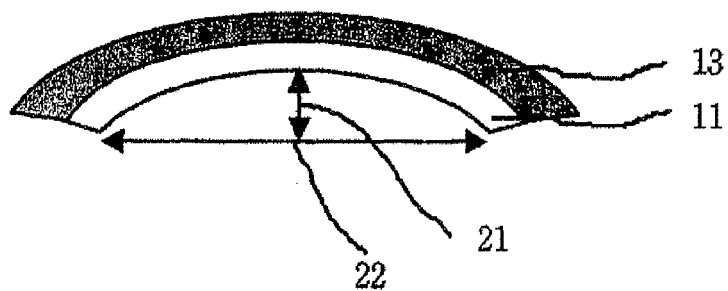
FIG. 2: a schematic view for showing the parameters required for measuring the curvature radius of a gallium nitride/sapphire thin film.

In accordance with the present invention, the curvature radius (Y) for evaluating the degree of bending deformation of a gallium nitride/sapphire thin film can be calculated by formula (II) using the parameters measured as shown in FIG. 2:

$$Y = D^2/8\Delta H \quad (II)$$

wherein D is the distance (22) between two ends of a deformed substrate, i.e., a thin film of sapphire (11) and a GaN layer (13), and $\Delta H$ is the height difference (21) of the deformed substrate measured at the center thereof.

Figure 3:
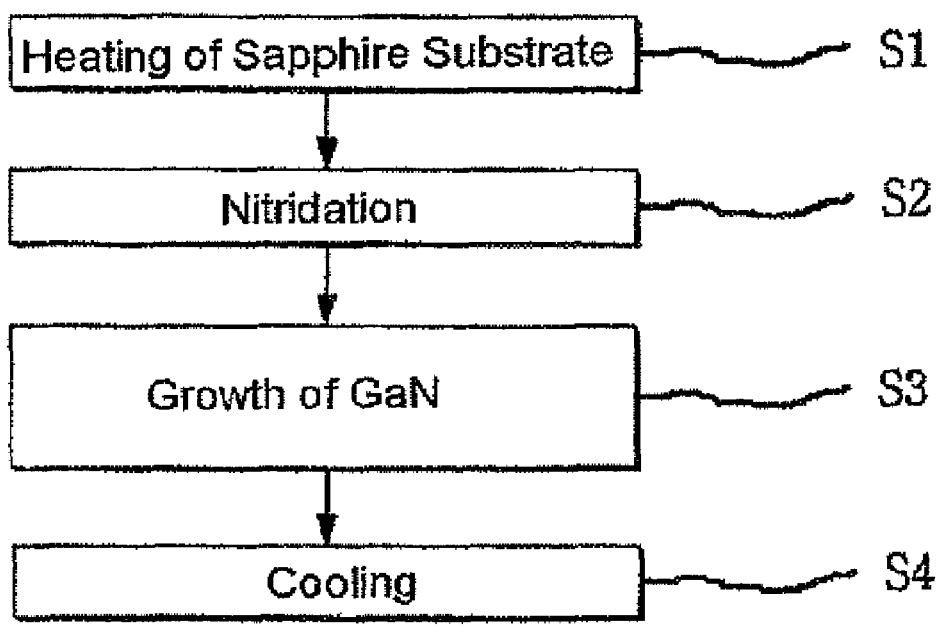
FIG. 3: a schematic flow diagram of a procedure for obtaining the inventive gallium nitride/sapphire thin film.

The inventive gallium nitride/sapphire thin film may be obtained by using a procedure as schematically shown in FIG. 3, which comprises heating a sapphire substrate (S1), nitridating the heated substrate (S2), growing a GaN layer on the nitridated substrate (S3) and cooling the resulting thin film (S4).

Specifically, in step S1, the sapphire substrate is heated to a temperature ranging from 800 to 1050° C.

Then, the nitridation procedure in step S2 may be conducted by a method as disclosed in U.S. Pat. No. 6,528,394, which is incorporated by reference in its entirety, wherein the sapphire substrate is firstly nitridated using a gaseous ammonia (NH$_3$) to form an AlN interface on the substrate, the nitridated substrate is treated with an NH$_3$—hydrogen chloride (HCl) gas mixture to etch the AlN interface partially, and then the surface-treated substrate is further nitridated to form hexagonal-like circular embossings (i.e., dot patterns) in the AlN interface.

In accordance with the present invention, in step S2, the mix ratio of HCl and NH$_3$ to be introduced in the AlN interface-formation step is adjusted in the range of 1:10 to 1:20 by volume so as to control the number and size of embossings to be formed in the AlN interface, thereby minimizing stress at the interface between the sapphire substrate and the GaN layer to be deposited thereon later. It is preferred that the AlN interface has embossings with a height of 150 nm or less and a traverse width of 10 to 100 nm in a density of 25 to 500 EA/μm$^2$.

In step S3, the GaN layer may be grown to a few μm thickness on the AlN-formed substrate using a conventional MOCVD or HVPE method. The growth temperature may be in the range of above 900° C. In the present invention, it is preferred that the GaN layer has a thickness of 0.5 to 20 μm, preferably about 10 μm. In some cases, the GaN layer may be grown to a greater thickness of 80 to 200 μm, preferably 80 μm. Such a thick GaN layer may be separated to be used as a freestanding substrate or seed substrate for the regrowth of a GaN single crystal.

In step S4, the gallium nitride/sapphire thin film is cooled to an ambient temperature.

Figure 4:
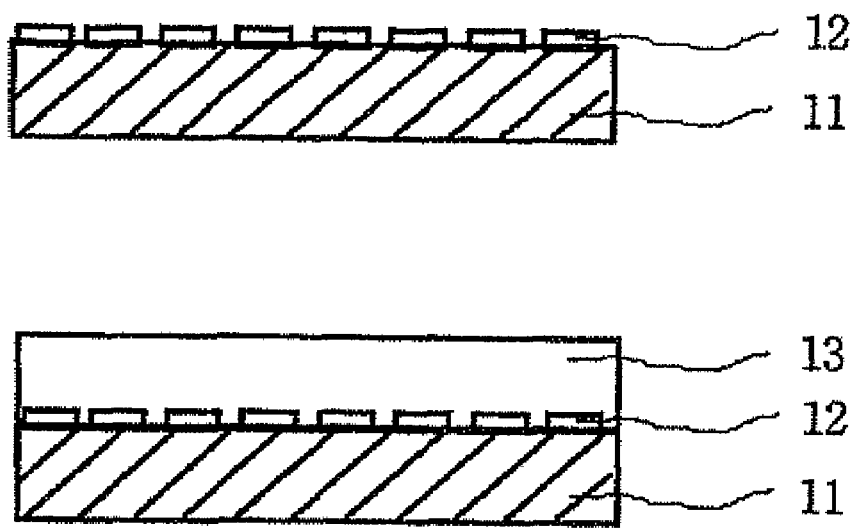
FIG. 4: a schematic diagram of a procedure for forming an AlN interface between a GaN layer and a sapphire substrate in an embossed shape.

FIG. 4 shows the procedures for forming AlN interface (12) between sapphire substrate (11) and GaN layer (13) in an embossed shape before the growth of GaN according to the steps S2 and S3.

Figure 5:
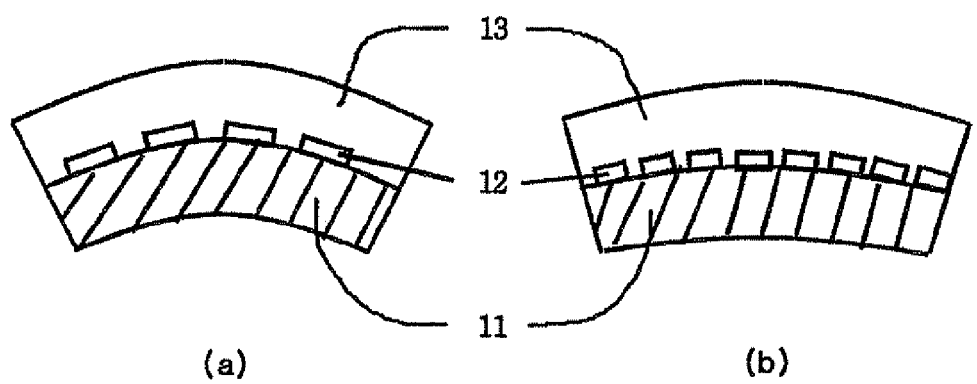
FIG. 5: a schematic diagram for showing the difference in the degree of bending deformation depending on the number of embossings present in an AlN interface.

As mentioned previously, the inventive gallium nitride/sapphire thin film exhibits reduced bending deformation due to minimized stress at the interface between the sapphire substrate and the GaN layer, which is obtained from the control of the number and size of embossings formed in the AlN interface. FIG. 5 illustrates that bending deformation of the gallium nitride/sapphire thin film having properly controlled embossings in the AlN interface is remarkably reduced.

The following Example and Comparative Example are given for the purpose of illustration only, and are not intended to limit the scope of the invention.

EXAMPLE 1

A sapphire substrate of 2 inch diameter and 0.43 mm thickness was heated and nitridated by treating successively with gaseous ammonia, a gas mixture of hydrogen chloride (HCl) and ammonia (NH$_3$) and gaseous ammonia, according to a method disclosed in U.S. Pat. No. 6,528,394 before the growth of a GaN layer, to obtain a gallium nitride/sapphire thin film having AlN interface in an embossed shape. At this time, the mix ratio of a gas mixture of hydrogen chloride (HCl) and ammonia used for forming embossings in the AlN interface was varied to 1:12, 1:13, 1:15 and 1:17 by volume, while the thickness of the GaN layer was varied to 1, 1.5, 4 and 8 μm.

The distance (D) between two ends of the substrate and the height difference (ΔH) of the sapphire substrate as shown in FIG. 2 were measured, and the measurements were used to calculate the curvature radius with formula (II). The results are shown in Table 1.

TABLE 1

| HCl:NH$_3$ (v/v) | Embossings in AlN interface | | | Curvature radius (m) to GaN thickness (μm) | | | | Sapphire substrate |
|---|---|---|---|---|---|---|---|---|
| | Traverse | | | | | | | |
| | Height (nm) | Width (nm) | Density (Ea/μm$^2$) | 1 μm GaN | 1.5 μm GaN | 4 μm GaN | 8 μm GaN | |
| 1:12 | 90~110 | 10~20 | 250~300 | 78.1 | 52.1 | 11.2 | 5.3 | 0.43 mm |
| 1:13 | 90~110 | 40~50 | 180~200 | — | — | 9.8 | 4.3 | |
| 1:15 | 90~110 | 70~80 | 80~100 | — | — | 8.2 | 3.8 | |
| 1:17 | 90~110 | 90~100 | 25 | — | — | 7.1 | 3.5 | |

As can be seen in Table 1, the curvature radius of the gallium nitride/sapphire thin film increases (i.e., bending deformation is reduced) as the flow rate of HCl increases and the sizes and/or number of the embossings are controlled.

EXAMPLE 2

The procedure of Example 1 was repeated except that a sapphire substrate of 2 inch diameter and 0.7 mm thickness was used and the HCl—NH$_3$ mix ratio was 1:12, to obtain a gallium nitride/sapphire thin film having AlN interface in an embossed shape. At this time, the thickness of the GaN layer was varied to 1, 2, 4 and 8 μm.

The results of the curvature radius for the gallium nitride/sapphire thin film thus obtained are shown in Table 2.

TABLE 2

| HCl:NH$_3$ (v/v) | Curvature radius (m) to GaN thickness (μm) | | | | Sapphire substrate |
|---|---|---|---|---|---|
| | 1 μm GaN | 2 μm GaN | 4 μm GaN | 8 μm GaN | |
| 1:12 | 125 | 76.9 | 28.6 | 24.1 | 0.7 mm |

EXAMPLE 3

The procedure of Example 1 was repeated except that a sapphire substrate of 2 inch diameter and 1.0 mm thickness was used and the HCl—NH$_3$ mix ratio was 1:12, to obtain a gallium nitride/sapphire thin film having AlN interface in an embossed shape. At this time, the thickness of the GaN layer was varied to 1, 2, 4 and 8 μm.

The results of the curvature radius for the gallium nitride/sapphire thin film thus obtained are shown in Table 3.

TABLE 3

| | Curvature radius (m) to GaN thickness (μm) | | | | |
|---|---|---|---|---|---|
| HCl:NH$_3$ (v/v) | 1 μm GaN | 2 μm GaN | 4 μm GaN | 8 μm GaN | Sapphire substrate |
| 1:12 | 142.9 | 87 | 35.1 | 25 | 1.0 mm |

COMPARATIVE EXAMPLE 1

A GaN layer was grown on the surface of a sapphire substrate of 2 inch diameter and 0.43 mm thickness using a conventional MOCVD method without forming an embossed AlN interface, to obtain a gallium nitride/sapphire thin film. At this time, the thickness of the GaN layer was varied to 1, 2, 3 and 4 μm.

The results of the curvature radius for the gallium nitride/sapphire thin film thus obtained are shown in Table 4.

TABLE 4

| GaN thickness (μm) | Curvature radius (m) | Sapphire substrate |
|---|---|---|
| 1 | 29.6 | 0.43 mm |
| 2 | 9.4 | |
| 3 | 6.5 | |
| 4 | 5.4 | |

COMPARATIVE EXAMPLE 2

A GaN layer was grown on the surface of a sapphire substrate of 2 inch diameter and 0.7 mm thickness using a conventional MOCVD method without forming an embossed AlN interface, to obtain a gallium nitride/sapphire thin film. At this time, the thickness of the GaN layer was varied to 1, 2, 5 and 7 μm.

The results of the curvature radius for the gallium nitride/sapphire thin film thus obtained are shown in Table 5.

TABLE 5

| GaN thickness (μm) | Curvature radius (m) | Sapphire substrate |
|---|---|---|
| 1 | — | 0.7 mm |
| 2 | 27.88 | |
| 5 | 10.8 | |
| 7 | 10.8 | |

From Tables 1 to 5, it can be seen that at the same sapphire thickness and GaN thickness, the curvature radius of the gallium nitride/sapphire thin film obtained according to the present invention is at least 2 folds longer than that of the gallium nitride/sapphire thin film obtained from Comparative Examples 1 and 2.

Figure 6:
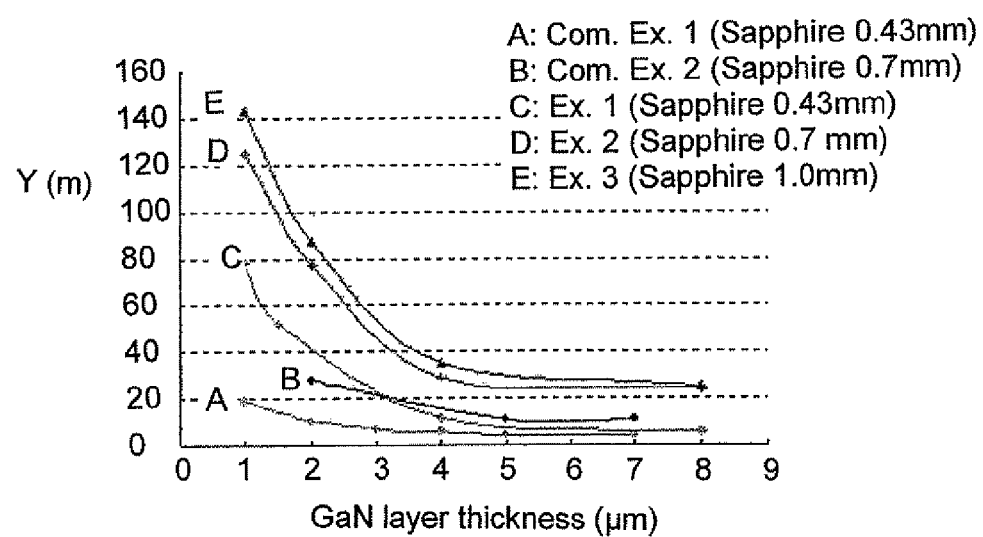
FIG. 6 graphs of the curvature radius values to the GaN layer thickness for the gallium nitride/sapphire thin films obtained in Examples 1 to 3, Comparative Examples 1 and 2.

FIG. 6 shows graphs plotting the curvature radius values in relation to the GaN layer thickness and sapphire substrate thickness for the gallium nitride/sapphire thin films obtained in Examples 1 to 3 wherein the HCl-NH$_3$ mix ratio is 1:12 (Curve C to E) and the gallium nitride/sapphire thin films obtained in Comparative Examples 1 and 2 (Curve A and B). Curve A and B are plots of formula (I) wherein $Y_0$ is $-107\pm2.5$, A is $24.13\pm0.50$, B is $141\pm4.5$, $T_1$ is $0.56\pm0.04$ and $T_2$ is $0.265\pm0.5$. Curve C to E are plots of formula (I) wherein $Y_0$ is $-293\pm2.5$, A is $72.52\pm0.74$, B is $372\pm4.5$, $T_1$ is $1.15\pm0.04$ and $T_2$ is $0.262\pm0.5$. That is, the inventive gallium nitride/sapphire thin films have remarkably reduced bending deformation as compared to those having no embossed AlN interface, under the same thickness condition of the sapphire substrate.

While the invention has been described with respect to the above specific embodiments, it should be recognized that various modifications and changes may be made to the invention by those skilled in the art which also fall within the scope of the invention as defined by the appended claims

What is claimed is:

1. A gallium nitride/sapphire thin film, wherein a curvature radius thereof is positioned on the right side of a curve plotted from the following functional formula (I):

$$Y = Y_0 + A \cdot e^{-(x_1-1)/T_1} + B \cdot (1-e^{-x_2/T_2}) \qquad (I)$$

wherein

Y is the curvature radius (m) of a gallium nitride/sapphire thin film, $x_1$ is the thickness (μm) of a gallium nitride layer, $x_2$ is the thickness (mm) of a sapphire substrate, $Y_0$ is $-107\pm2.5$, A is $24.13\pm0.50$, B is $141\pm4.5$, $T_1$ is $0.56\pm0.04$, and $T_2$ is $0.265\pm0.5$.

2. The gallium nitride/sapphire thin film of claim 1, wherein the curvature radius thereof is positioned on the left side of a curve plotted from the formula (I) when $Y_0$ is $-293\pm2.5$, A is $72.52\pm0.74$, B is $372\pm4.5$, $T_1$ is $1.15\pm0.04$ and $T_2$ is $0.262\pm0.5$.

3. The gallium nitride/sapphire thin film of claim 1, wherein the curvature radius thereof is positioned on a curve plotted from the formula (I) when $Y_0$ is $-293\pm2.5$, A is $72.52\pm0.74$, B is $372\pm4.5$, $T_1$ is $1.15\pm0.04$ and $T_2$ is $0.262\pm0.5$.

4. The gallium nitride/sapphire thin film of claim 1, which comprises an aluminum nitride (AlN) interface between the GaN, layer and the sapphire substrate in an embossed shape.

5. The gallium nitride/sapphire thin film of claim 4, wherein the AlN interface is formed by treating the sapphire substrate successively with gaseous ammonia (NH$_3$), a gas mixture of hydrogen chloride (HCl) and ammonia and gaseous ammonia.

6. The gallium nitride/sapphire thin film of claim 5, wherein a gas mixture of HCl and NH$_3$ has a mix ratio ranging 1:10 to 1:20 by volume.

7. The gallium nitride/sapphire thin film of claim 4, wherein the AlN interface has embossings of a height of 150 nm or less and a traverse width of 10 to 100 nm in a density of 25 to 500 EA/μm$^2$.

8. The gallium nitride/sapphire thin film of claim 1, wherein the gallium nitride layer has a thickness of 0.5 to 20 μm.

9. The gallium nitride/sapphire thin film of claim 1, wherein the gallium nitride layer has a thickness of 80 to 200 μm.

10. An optoelectronic or electronic device which comprises the gallium nitride/sapphire thin film of claim 1 as a substrate.

11. The optoelectronic or electronic device of claim 10, which is a light emitting device.

12. A gallium nitride layer separated from the gallium nitride/sapphire thin film of claim 1.

13. The gallium nitride layer of claim 12, which has a thickness of 80 to 200 μm.

* * * * *